United States Patent

Gudesen et al.

[11] Patent Number: 6,005,817
[45] Date of Patent: Dec. 21, 1999

[54] METHOD FOR PARALLEL WRITING AND READING OF DATA IN AN OPTICAL MEMORY, A WRITING/READING DEVICE FOR USE BY THE METHOD AND USES OF THE METHOD AND THE WRITING/READING DEVICE

[75] Inventors: Hans Gude Gudesen, Gamle Fredrikstad; Per-Erik Nordal, Nesbru, both of Norway

[73] Assignee: Opticom ASA, Oslo, Norway

[21] Appl. No.: 08/981,661

[22] PCT Filed: Jul. 18, 1996

[86] PCT No.: PCT/NO96/00187

§ 371 Date: Jan. 8, 1998

§ 102(e) Date: Jan. 8, 1998

[87] PCT Pub. No.: WO97/04448

PCT Pub. Date: Feb. 6, 1997

[30] Foreign Application Priority Data

Jul. 18, 1995 [NO] Norway ..................... 952855

[51] Int. Cl.⁶ ..................................... G11C 7/00
[52] U.S. Cl. ..................... 365/215; 365/106; 365/234
[58] Field of Search ..................... 365/215, 106, 365/234, 112

[56] References Cited

U.S. PATENT DOCUMENTS 4,633,445  12/1986  Sprague .
5,436,871   7/1995  Russell .
5,479,384  12/1995  Toth et al. .
5,587,820  12/1996  May et al. ............................ 359/72
5,696,714  12/1997  Russell ................................ 365/106

FOREIGN PATENT DOCUMENTS

WO91 11804  8/1991  European Pat. Off. .
WO93 13529  4/1993  European Pat. Off. .

Primary Examiner—Huan Hoang

[57] ABSTRACT

In a method for parallel writing and reading of data in an optical memory, the optical memory includes one or more microlenses for accessing a memory medium, individually addressable elements arranged in one or two-dimensional matrices in a write/read device are activated. The activation of an element physically influences one or more localized areas in a data carrying layer in the memory for writing and reading of data carrying structures in the localized area. Writing and reading is thus performed on the basis of a relationship between the geometric location of the element in the matrix and the position of the localized area(s) in the data carrying layer of the memory. A write/read device includes individually addressable elements which are arranged in one or two-dimensional matrices, the addressable element being arranged to be activated in order to physically influence one or more of the above-mentioned localized areas. Use for such a configuration includes, for example, writing and reading in optical memories which consist of 1–100 microlenses with associated data carrying layers and in optical memories which consist of a transparent spherical particle having a transparent layer to which is applied a data carrying film arranged on one side thereof.

62 Claims, 7 Drawing Sheets

DEFINITION OF BEAM INCIDENCE
DIRECTION (θ,φ)
(STANDARD POLAR CO-ORDINATES)
*Fig. 1a*
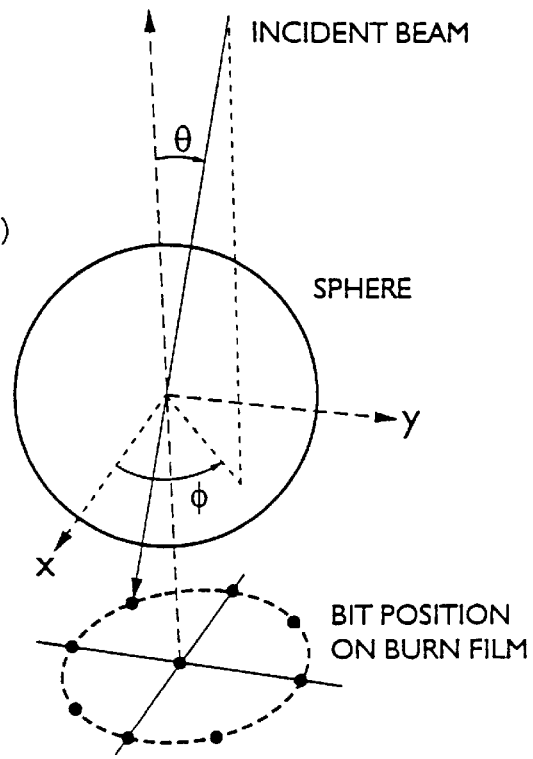
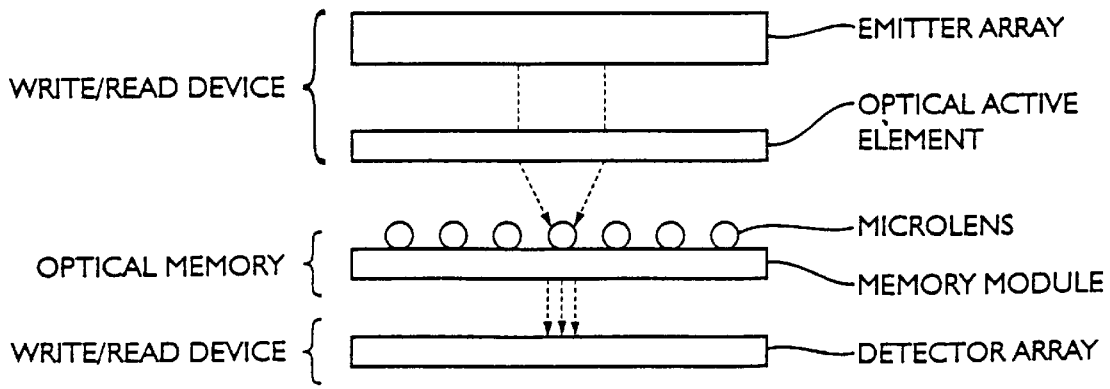
*Fig. 1b*

FREE-SPACE PROPAGATION

COLLIMATOR SOLUTION

PARTIAL ILLUMINATION OF LENS
APERTURE BY LASER CLUSTER

PARTIAL ILLUMINATION OF LENS
APERTURE THROUGH SLM

*Fig. 2* MATRIX SCHEMES FOR ($\theta,\phi$) - ADDRESSING
ACTIVATED ELEMENTS INDICATED BY ARROWS

ADDRESSING BY TWO
SIMULTANEOUS LIGHT BEAMS
AT WRITING SITE

COMBINED ELECTRONIC
AND PHOTON ADDRESSING

PHOTOACTIVATED LIGHT VALVES

ADDRESSING BY OPTICALLY OR
ELECTRONICALLY ADDRESSED
SPACIAL LIGHT MODULATORS

Fig. 3 THE ADDRESSING FACTORS (x,y) AND (θ,φ) CAN BE COMBINED IN A VARIETY OF ADDRESSING ARCHITECTURES

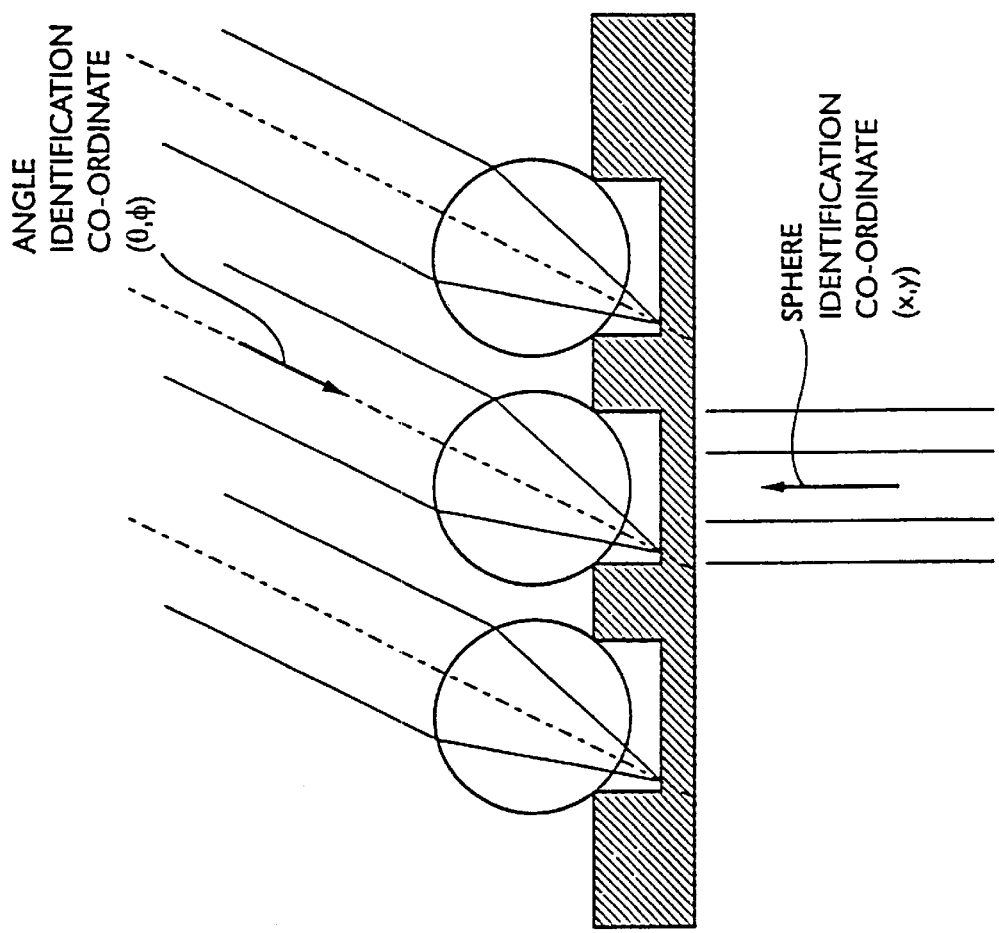
Fig. 3A1  PARALLEL WRITING IS PERFORMED BY COMBINING TWO ADDRESSING FACTORS, THE SPHERE IDENTIFICATION CO-ORDINATE (x,y) AND THE ANGLE IDENTIFICATION CO-ORDINATE (θ,φ) SIMULTANEOUSLY

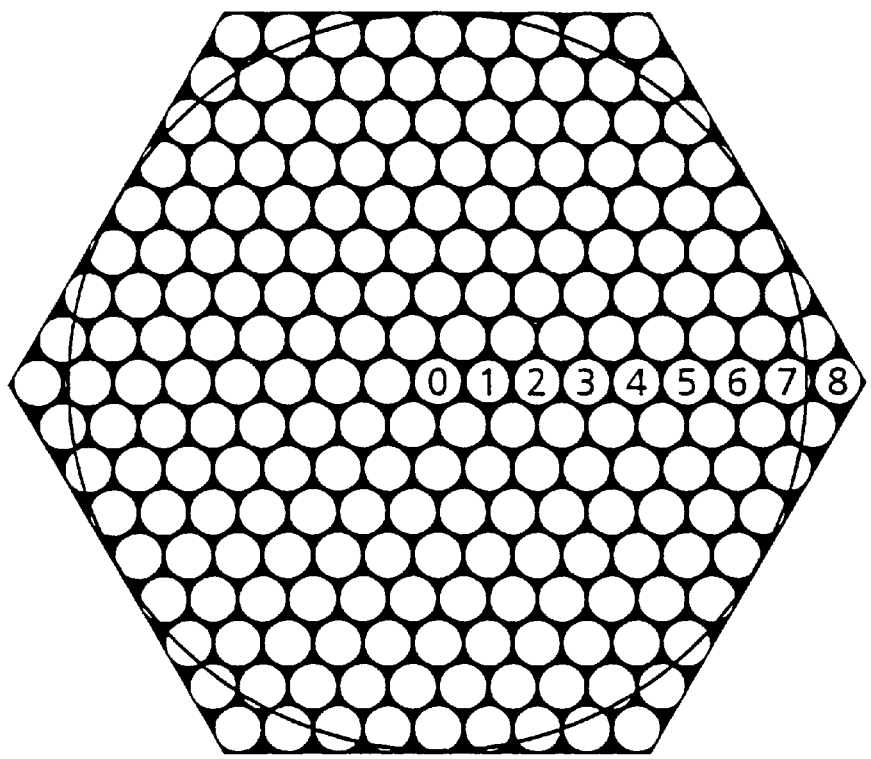
Fig. 4 MICROLENS WITH ITS ASSOCIATED DATA SPOT PATTERN SHOWN HERE: 217 SPOTS IN PATTERN

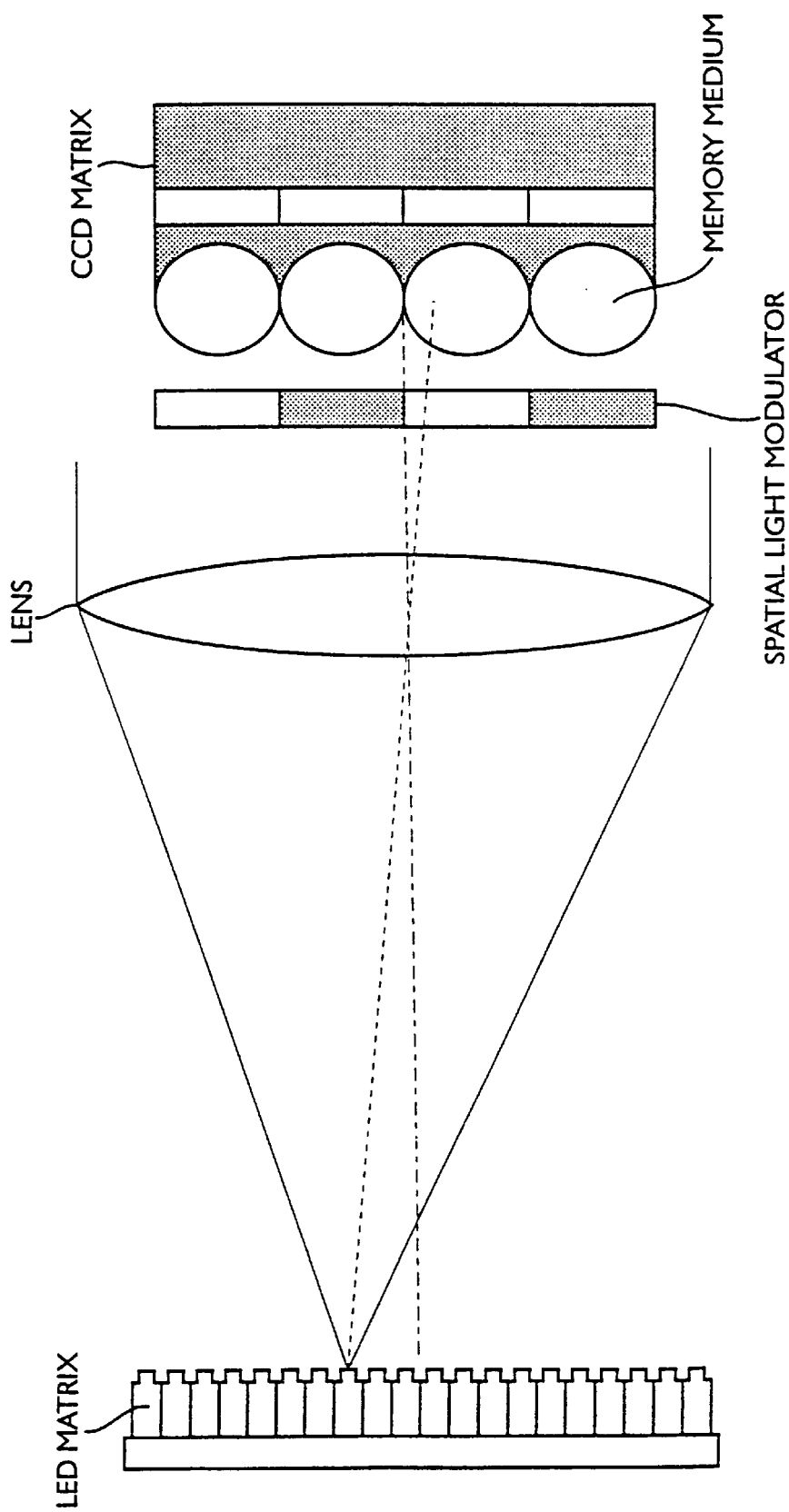
Fig. 5  EXAMPLE OF PARALLEL WRITING BY SPATIAL LIGHT MODULATOR

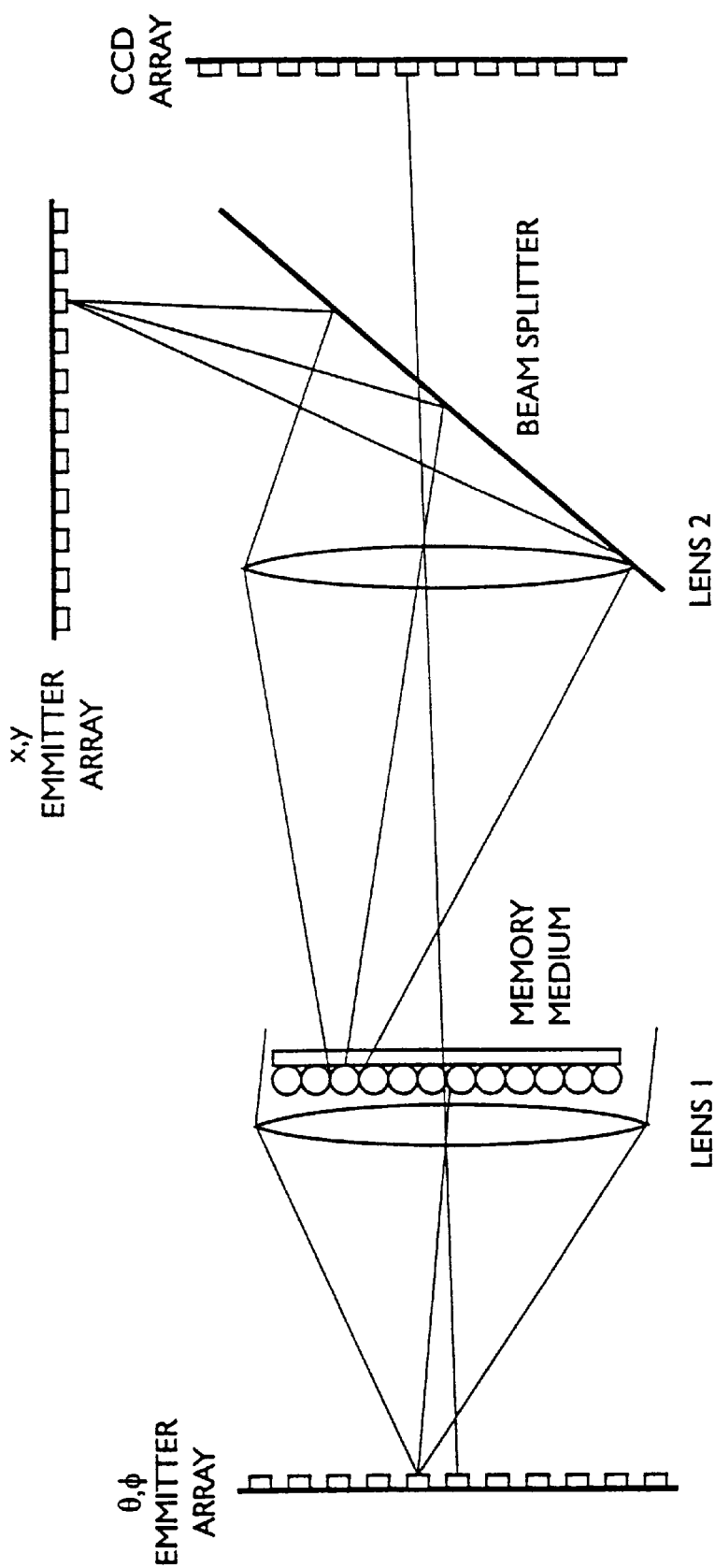
Fig. 6  WRITE/READ DEVICE WITH (θ,φ) ADDRESSING BY COLLIMATED LIGHT FROM AN EMMITTER ARRAY AND (x,y) ADDRESSING BY LIGHT - INDUCED SENSITIZATION OF THE INFORMATION- BEARING LAYER IN THE MEMORY MEDIUM (WRITING) OR ANALYSIS OF PIXEL POSITIONS ON CCD DETECTOR ARRAY (READING)

METHOD FOR PARALLEL WRITING AND READING OF DATA IN AN OPTICAL MEMORY, A WRITING/READING DEVICE FOR USE BY THE METHOD AND USES OF THE METHOD AND THE WRITING/READING DEVICE

This application is the national phase under 35 U.S.C. §371 of prior PCT International Application No. PCT/NO96/00187 which has an International filing date of Jul. 18, 1996 which designated the United States of America, the entire contents of which are hereby incorporated by reference.

FIELD OF THE INVENTION

The invention is directed to a method and a write/read device for parallel writing and reading of data in an optical memory more specifically, the present invention is directed to such a method and device where the optical memory comprises one or more microlenses for accessing of an optical memory medium, microlens has a uniquely defined x,y position in a coordinate system assigned to the memory medium. A number of data carrying spot positions in a data carrying layer in the memory medium is assigned to each microlens. Each spot positions in a data carrying structure in the data carrying layer and is assigned a data address which is in a one-to-one correspondence with a set of angles of incidence $\theta,\phi$ for light which is directed towards the microlens,. Each angle of incidence is defined as spherical coordinates in the coordinate system assigned to the memory medium.

In more general terms, the invention concerns parallel writing and reading of to data in optical memory media with high memory capacity, wherein the memory media comprise a large number of microlenses immobilized in dense arrays on or in a planar substrate which also contains a data-recording film or a data-recording volume in proximity to or adjacent to the microlenses, or in memories with low capacity, wherein each microlens forms a separate physical entity, or a memory element which includes a microlens and a data carrying surface or data carrying volume which is physically integrated with each microlens.

DESCRIPTION OF RELATED ART

As examples of a high capacity microlens-based memory medium, reference is made to NO patent applications no. 90 0443 and no. 95 2542. As an example of low capacity optical memories reference is made to the fact that there are known in the prior art objects (particles) or elements with information-bearing spot patterns, suitable for use as identification markers, etc.

The prior art includes digital optical data carriers which are widely used for storing and distributing data, typically in the form of laser-addressable, rotating discs. Recently, optical cards in a rectangular format with lower storage capacity than the discs have also been introduced. Nevertheless, compared with conventional data storage media, these types of storage media have a relatively large storage capacity, and consequently the cost of loading massive amounts of data into memories of this kind becomes a critical factor. If the data are written sequentially along a single track, operating and capital expenses may completely overshadow the cost of producing the data carrier itself. To illustrate by an example: Assume, e.g., that a data carrier has to receive 2 Gbytes of information by sequential laser writing of spots along a track in the data carrier. If the data are written at a rate of 1 Mbyte/s, fully 33 minutes will elapse before the data transfer is complete. For mass markets this is untenable. On the other hand, a substantial increase in the writing speed, e.g., beyond 1 Mbyte/s is difficult to achieve by evolutionary refinements of current single-beam writing technologies, such as increasing the spinning speed of the disc.

By writing with several lasers in parallel, the total data transfer rate can be speeded up, essentially multiplying the writing rate by the number of individually controllable lasers, as is described, for example, in Laser Focus World, August 1993, page 64. Recently, a system employing two four-beam laser arrays was announced by Asaka/Shibasoku & Co. of America, Los Angeles, Calif., USA, providing reading rates at more than 12 Mbytes/s, an improvement by a factor of ten over previous commercial technology, according to Asaka. It is not clear, however, whether their system can support similar high data rates during writing.

Parallel schemes similar to the one referred to above are currently under development at several institutions all over the world. However, they all share the same problem, namely that of simultaneously keeping all the lasers focused on the track with the required precision. This implies that if the lasers are physically clustered in a single package, e.g. a monolithic array, they must track collectively, which in turn implies that only a small number of laser beams can be used to write on adjacent tracks. Moreover, the number of individual lasers or small groups of lasers which can operate simultaneously on the same data carrier is limited, since they have to address positions of the data carrier that are well separated to allow room for independent tracking and servo-mechanisms for focusing. The above-mentioned four-beam technique of Asaka represents an attempt to take these factors into account. However, there appears to be a relatively high degree of complexity involved, and it is to be expected that further refinements must contend with quickly diminishing returns. Another well-known technique for parallel loading of data with large capacity into optical read-only memories (optical ROMs), for applications such as the production of music and video carrying media is, after the use of hot stamping or molding methods, where data are transferred to the medium by the simultaneous creation of topographic microstructures (pits) in a substrate. In certain cases such techniques are undesirable. This may be due to technical constraints posed by the particular optical storage medium in question, the need to add information to that which is already loaded into the data carrier (Write Once Read Many Times or WORM media), or the need to erase and rewrite information on the data carrier.

For writing or reading low capacity optical memory media of the type mentioned in the introduction, no known techniques exist at present which are suitable for parallel writing and reading of large data volumes.

SUMMARY OF THE INVENTION

The object of the invention is to provide a method and a device for parallel writing and reading of data to and from known per se microlens-based optical memory media and whereby some or all of the disadvantages associated with the prior art are avoided, thus enabling large data volumes to be transferred at a high data rate and thereby permitting the mass production of optical memory media, e.g. with a view to the reproduction of music or video sources.

This and other objects may be achieved according to the invention with a method characterized by activating individually addressable elements which are arranged in one or more two-dimensional arrays or matrices in a write/read device, in such a manner that the activation of an element physically influences one or more localized areas in the data carrying layer for writing and reading of data carrying structures in the localized area(s), writing and reading being performed on the basis of a uniquely defined one-to-one relationship or one-to-many relationship between the geometric location of the element in the matrix and the position of the localized area(s) in the data carrying layer of the memory medium, the geometric location of an element and the position of a localized area being mutually related in the coordinate system assigned to the memory medium. This and other objects may also be realized by providing a write/read device including individually addressable elements arranged in one or more two-dimensional arrays or matrices, the addressable elements being arranged to be activated in order to physically influence one or more localized areas in the data carrying layer in the memory for writing and reading of data carrying structures in defined positions x, y, θ, φ in the localized area(s), whereby writing and reading are performed on the basis of a uniquely defined one-to-one relationship or a one-to-many relationship between the geometric location of the element in the matrix and the position of the localized area(s) in the data carrying layer of the memory as the geometric location of an element and the position of a localized areas are mutually related in the coordinate system assigned to the memory medium.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will now be explained in more detail with reference to the basic technique employed and specific embodiments, taken in association with the accompanying drawing in which:

FIG. 1a illustrates the general principle of a method for writing and reading of an optical memory by means of a beam of light which transverses a microlens, FIG. 1b illustrates the general principle of the write/read device according to the present invention and used for writing/reading of an optical memory, FIG. 3A1 illustrates an example of parallel writing by combining the (θ, φ) and (x, y) addresses simultaneously, FIG. 4 is a schematic illustration of a microlens with assigned data spot pattern as employed in an optical memory which has to be written/read by the method according to the present invention, FIG. 5 illustrates examples of parallel writing according to the present invention with the use of a spatial light modulator, and FIG. 6 illustrates a write/read device according to the present invention.

DETAILED DESCRIPTION OF PREFERRED EMBODIMENTS

Figure 2A:
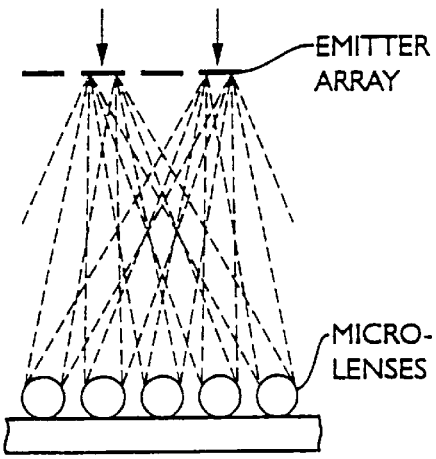
FIGS. 2A–2D are embodiments of the method according to the present invention for θ, φ-addressing of an optical memory.

FIG. 1a illustrates a basic unit consisting of a microlens in the form of a transparent sphere maintained in a fixed position relative to a surface containing a thin layer of material which can change its optical properties when illuminated with a sufficiently intense beam of light (termed "burn film" below). Under each microlens, a set of data spot positions are arranged in a pre-defined pattern. Data at a given spot position can be written and read by illuminating the microlens at an angle which is specific for that spot position. Thus each spot position on the data carrier can be associated with an address describing the angular coordinates θ, φ of the spot position under the microlens. In high capacity optical storage media and microlenses arranged in arrays, the position x,y of the microlens relative to a coordinate reference on the medium completes the address of the spot position, which is then given as x,y,θ,φ).

The writing process consists in illuminating a microlens with a number of beams of light at a corresponding number of different angles of incidence. Each beam of light is focused by the microlens on to the data carrying surface of the volume element in a small area where the intensity of the light is sufficient to cause a change in local, optical properties of the surface or volume element. The pattern of such elements with altered optical properties in the data carrying surface or the data carrying volume represents the written data, which can be determined by a subsequent read-out of data.

Data are read by illuminating each spot position and determining the local optical properties, i.e. transmissivity or reflectivity. Thus a logic "0" may be represented by an opaque film within the spot area, while a logic "1" may be a transparent spot burnt into the film at that point. During read-out, each microlens may be illuminated in turn by a laser beam which tracks along a row of microlenses and illuminates each one in turn at the specified angle θ, φ. Alternatively, several, for example many thousands, of microlenses may be simultaneously illuminated in parallel and imaged on to a matrix detector, followed by an image analysis which effectively provides tracking and read-out in a completely electronic mode.

The problem with loading and accessing massive amounts of data to and from microlens-based memory media is directly analogous to that described above for traditional optical data storage media If a single tracking light beam is used for sequential addressing of bits, even the highest attainable scanning and pulsing speeds will prove to be too slow.

As will be shown below, microlens-based media according to the present invention will permit large scale parallel accessing of bit positions by activating a single matrix or multiple matrices. The latter may be in the form of light transmitters arranged in matrices or arrays or spatial light modulators emitting multiple light beams for writing and reading, leading to greatly increased data transfer rates as compared to the single-beam case. Other types of electronically addressable matrix arrays which also provide high-speed accessing of data are also described below, and will also be able to implement optical write/read schemes without the use of a mechanical scanning motion.

The uniform inventive concept which forms the basis for the present invention is based on the fact that each bit in a microlens-based medium can be accessed by electronically activating individual elements on matrices that are very coarse-grained physically compared to the dimension of each datum spot in the memory medium. This is achieved according to the present invention by employing microlenses that are large compared to the bit spots. Furthermore, the medium and the write/read device can be designed in such a manner that each datum spot position can be defined by an address of the form x,y, θ,φ which can be separated into independently addressable x,y and θ,φ components. Here, x,y defines which microlens is involved and the angular coordinates θ,φ define the exact position under this microlens. The independent addressing of the x,y and θ,φ coordinates implies that available spot positions relative to each microlens are identical or simply interrelated, for example shift or magnification.

FIG. 1b illustrates the main components in the write/read device according to the invention and the main components in an optical memory which has to be written and read with this device. The write/read device comprises an emitter matrix, possibly an optically active element and a detector matrix. During writing/reading an optical memory with microlenses arranged on a memory medium is located between the emitter matrix and a detector matrix.

FIGS. 2 and 3 show a set of basic schemes where electronically activated matrices are used to access θ,φ and x,y coordinates independently of each other. These different concepts can be combined in a number of ways to provide complete x,y,θ,φ addressability in practical equipment Some important examples of this will now be discussed in more detail.

First of all, the principles of matrix addressing of angular coordinates θ, φ will be discussed, based on free-space propagation or collimator solutions respectively.

Free-space Propagation

As shown in FIG. 2a, each element in an array of light emitters illuminates a certain portion of the memory medium, with light travelling in a straight line from each emitter to each microlens. Each microlens creates a demagnified image of the light-emitting elements on the array, each array element being in one-to-one correspondence with a specific bit spot position in the burn film under the microlens. The relative dimensions are such that the angular spread of light incident from any given light source on to any given microlens is negligible, since the physical position X,Y of each light-emitting element is known, as well as the light emitter-to-microlens distance and microlens position x,y (see below), and the angle of incidence coordinates θ,φ are also defined. Depending on the extent of the illuminated area, the set of incidence angles need not be identical for all microlenses. This is of no consequence, however, when writing to memory elements which are subsequently to function as individual units (see below). In high capacity optical data memories, the correct θ,φ addressing is obtained by employing the same illumination configuration during the write and read operations.

Collimator-based Technology

Figure 2B:
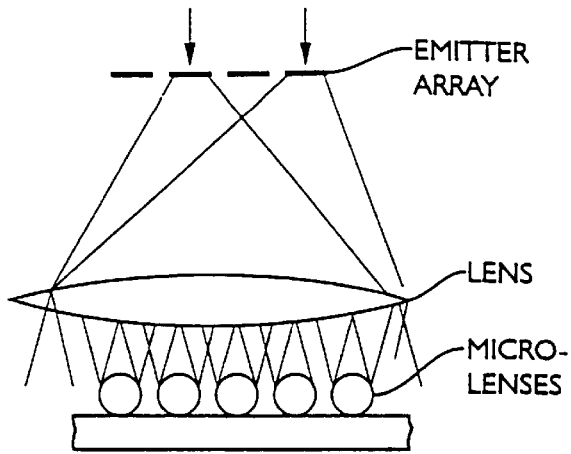
Figure 2C:
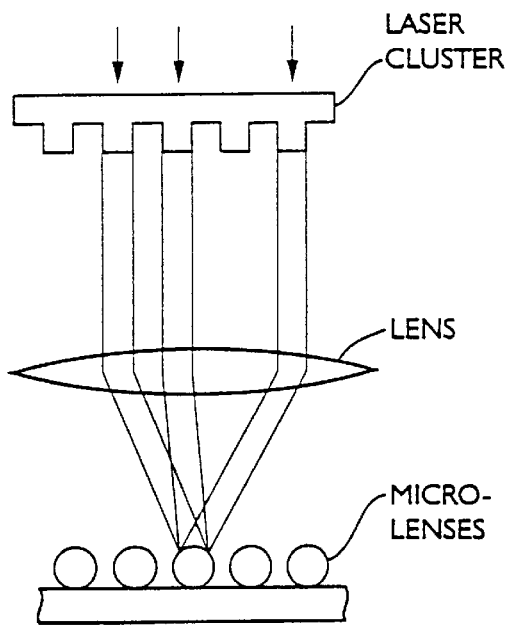
Figure 2D:
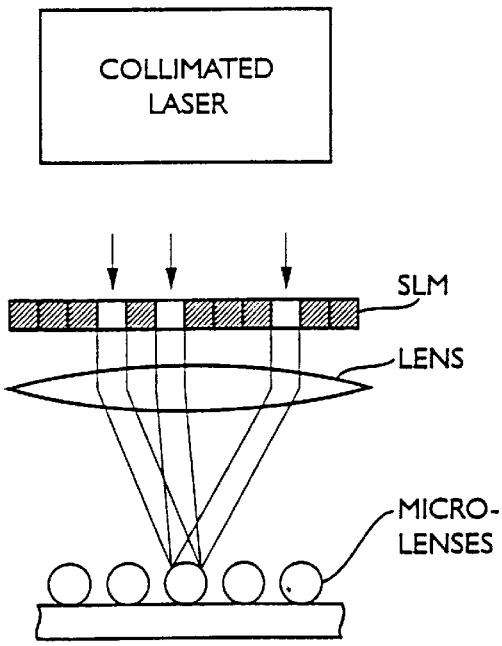

FIG. 2b shows simultaneous θ,φ addressing of a large number of microlenses by means of matrix light emitter arrays. Light from a one or two-dimensional emitter array is collimated and directed towards the microlenses at angles defined by the light emitter positions on the array. In this way light is focused on the same θ,φ spot position under each microlens. As shown in FIG. 2c, parallel beams of light impinging on a lens will be focused and directed by the lens in such a manner that the light in each beam strikes the focal plane at an incidence angle θ,φ which is a one-to-one relationship with the position where the light beam struck the lens. The parallel light beams may be emitted by a cluster of collinearly oriented lasers as illustrated in FIG. 2c, or they may be generated from a broad, collimated light beam, e.g. from a laser or a coherent source, which is selectively blocked or transmitted through a spatial light modulator (SLM) in front of the lens, as illustrated in FIG. 2d.

The principles of matrix addressing of space coordinates x,y will now be discussed.

It has been considered to be expedient to separate writing and reading in the embodiment of the present invention.

In writing, for example, it is possible to employ two basically different methods. The first is based on matrices which physically allow light to pass or block light impinging on the various x,y locations. The second is based on providing a matrix-addressable sensitizing influence at those x,y locations which are to be written.

In reading, light directed towards specific x,y locations may be physically allowed to pass or blocked in the same way as for writing. Alternatively, during large scale read-out by imaging on to a detector array, pixel locations on the detector array can provide the desired x,y coordinates for each microlens in the memory medium.

There now follows a more detailed account of specific, relevant principles which are only employed for matrix addressing.

Light-induced Sensitization

Figure 3A:
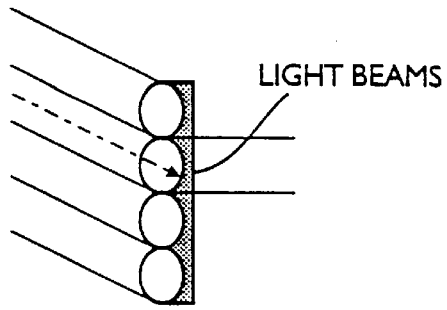
FIGS. 3A–3D illustrate various architectures where θ, φ-addressing is combined with x,y addressing of an optical memory.

FIG. 3a shows a generic principle suitable for writing. Controlling beams of light defining the x,y microlens coordinates where writing is to take place are applied to the burn films under the microlenses in question, rendering these areas sensitive to writing when illuminated through the microlens. The burn film in this case is of the AND type, i.e. writing only takes place if both the controlling light beam and the writing light beams are present simultaneously at the same position in the burn film. Thus, even though all microlenses receive and focus the writing light, actual writing only takes place at microlenses selected by the controlling light beams. A simple and general scheme for implementing the AND function is to employ a burn film with a writing threshold, i.e. no writing takes place as long as the writing beam intensity is below a threshold value. In this case, the controlling light beam and the writing light beam are each below the threshold for writing when applied separately, and above the threshold when added. A concrete example of this is tellurium WORM film which responds to the local temperature. Alternatively, photo-induced light absorption in semiconducting burn films can provide the desired AND function.

Electrically Induced Light Sensitization

Figure 3B:
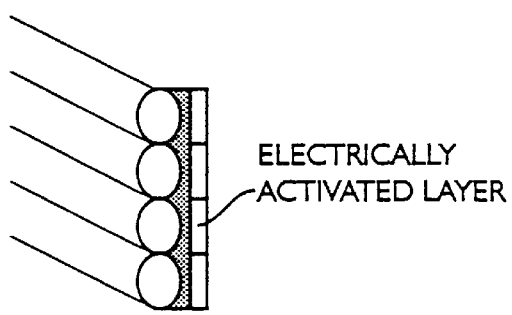

FIG. 3b shows another generic principle suitable for writing. In this case, an electrically addressable matrix of sensitizing elements in register with the microlens pattern renders the areas under selected microlenses writable. Physical mechanisms can be, e.g. local heating below the threshold for writing, in analogy with the optical pre-heating described above.

Alternatively, the burn film can be exposed locally to an electrical field which makes the burn film sensitive to the writing light beam which is focused through the associated microlens.

Photo-activated Light Valve

Figure 3C:
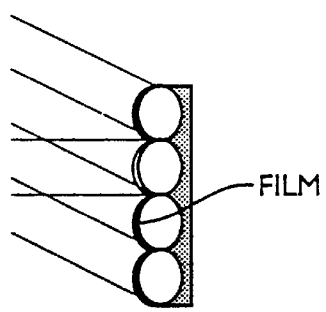

This principle is illustrated in FIG. 3c. A photo-activated film controls access of write and read light beams on to the microlenses. Two types of film can be used. One is non-transmitting in its non-activated state, becoming transmitting when illuminated by light of appropriate wavelength and intensity, and returning to its non-transmitting state when the controlling light beam is turned off. The controlling light beam illuminates individual microlenses in the medium as required. The other type of film is transmitting in its non-activated state, becoming less transmitting or opaque when illuminated by a controlling light beam.

Spatial Light Modulator SLM

Figure 3D:
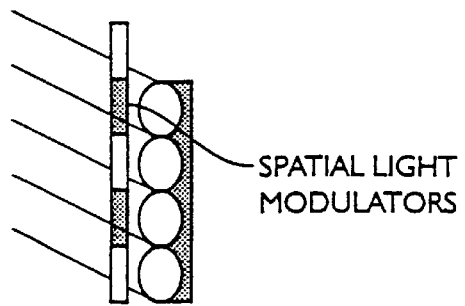

As shown in FIG. 3d, a spatial light modulator (SLM) with its pixels in register with the microlenses in the medium is configured to block or allow light to pass at the appropriate x,y locations. The SLM may be configured either electronically by application of voltages to each pixel, or optically by a separate light addressing beam striking the SLM pixels. Furthermore, the SLM may operate in either transmissive or reflective mode.

Parallel Reading by Means of a Matrix Detector

Microlens-based media permit read-out by simultaneous imaging of a large portion of the memory medium on to a matrix detector. For each illumination direction θ,φ, the logic state at each microlens manifests itself by the optical response (brightness level) at each microlens, which is determined by the elements on the detector matrix. Microlenses may be allocated in a one-to-one fashion to the detector matrix, or they may be oversampled by a more fine-meshed detector matrix. Instead of an imaging system, detection by pixels close to the microlens-based medium may be used (so-called "proximity imaging"). The basic principle here is that the x,y coordinates in the memory medium are inferred from the known positions of the corresponding pixels on the matrix, these positions being preferably determined by an electronic control unit for the detector matrix. Several schemes are available which are capable of providing position references relative to a suitable x,y coordinate system in the memory medium, including pre-written referencing spots in the medium which can be recognized and used by the software in a post-detection routine.

Examples of embodiments of the present invention will now be described.

EXAMPLE 1

Matrix Writing on Memory Particles

The memory particles are spread out on a surface under a matrix of light sources which can be configured physically or electrically in pre-defined patterns, cf. FIG. 2a. In this case, the microlenses are not arranged in specific patterns, but may occupy random positions on the surface.

An important class of memory particles are transparent microspheres which image the illuminating matrix on to a surface near the rear wall of each sphere, i.e. the surface of the sphere opposite to that where light enters the sphere. For light sources removed a distance which exceeds the microsphere diameter, and for microspheres with refractive index near 2.0, the image of the illuminator matrix will be on the actual rear wall of the microsphere. The rear wall is coated with a thin film which is transformed locally at the points where each element of the illuminator matrix is imaged, when the illuminator in question emits a brief, powerful light pulse. In this manner, each microsphere is marked on one side by a pattern of spots which replicates the spatial pattern of activated light sources on the matrix illuminator unit. By assigning one bit of information to each available spot position, and by using microspheres of diameter 40 μm or more, it was found that practical systems as described here can create memory particles where each carries up to several kilobytes of information.

Other types of microlens-based memory particles are possible, e.g. where each microlens is physically integrated with a data carrying film on a spacer structure, the latter being oriented away from the illuminator matrix. An example is a transparent plastic microsphere lined on one side with a transparent coating, the latter being covered in turn by a thin film where the spots are formed during writing.

Instead of "free-space" illumination as illustrated in FIG. 2a, a collimator-based configuration as in FIG. 2b can be used. Both of these will generally demand higher power from each illuminator element compared with tracking solutions described in example 2 below.

FIGS. 2c and 2d illustrate schemes where the whole illuminator matrix is aligned on one microlens at a time. As discussed in more depth in the following example, in the case of high capacity memory media, high writing speeds can be achieved in this way, provided the microlenses are laid out in a spatial arrangement which permits rapid tracking from one microlens to the next. In the present case, this can be achieved by attaching the memory particles in a controlled pattern on a carrier substrate or the like during exposure to the writing radiation. Afterwards, the particles can once again be released to form physically separate memory elements.

EXAMPLE 2

Parallel Writing with Collectively Tracking Laser Cluster

FIG. 2c illustrates a parallel writing scheme where light beams that are incident from different directions converge on each microlens in turn, the x,y address being selected by means of a servo-controlled tracking system. The angular address θ,φ is chosen by activating an emitter in an appropriate position in the light emitter matrix, which in this case is a cluster of individually controllable lasers. The laser beams striking each microlens from different directions are focused on to data spot positions below the microlens. It is obvious that each laser in the cluster will strike only one spot position, the angular coordinates θ,φ of this position being uniquely defined by the position of the laser in the cluster.

In the configuration illustrated above, the pattern of spot positions under the microlens corresponds to the pattern of lasers in the cluster. An example of spot positions under a single microlens is shown in FIG. 4. Analysis and experiments have shown that a single microlens in the form of a transparent plastic sphere may support from several hundred to several thousands of spots, depending on the optical configuration, the wavelength of the light and the size of the sphere, the typical diameter range being 50–100 μm.

Monolithic VCSEL (Vertical Cavity Surface Emitting Laser) matrices with individually addressable microlasers are now commercially available and in rapid development regarding key parameters such as emission wavelength and power, number of lasers in each cluster, efficiency, etc. In this context reference is made, e.g., to product information from VIXEL Co., Broomfield, Colo., USA or the article by Jewel J. and Albright G.: "Arrays of vertical surface emitting lasers go commercial", Optics & Photonics News, March 1994, page 8. These devices are ideally suited for parallel writing in microlens-based media as illustrated in FIG. 2c. The pattern of individual laser elements is formed during the VCSEL production process as a monolithic structure, drawing extensively on technologies developed by the semiconductor wafer processing industry. Each cluster of lasers lends itself well to miniaturization and mass production. Individual laser elements in the cluster can be electrically driven either by a separate wire contact for each element, or by matrix addressing.

An alternative to using a single lens is to employ several optical elements which focus and direct each laser beam individually. The optical elements can be an integral part of the VCSEL structure (see above-mentioned product information from Vixel Co.) or they may be a separate microlens array.

With one laser being assigned to each of the available spot positions under the microlens, any desired combination of data point logic states associated with a given microlens spot pattern can be created by pulsing an appropriate set of lasers in the cluster. This can be done simultaneously or within a time which is short compared to the time required for alignment of the lasers with the microlens.

Numerical Estimates of Data Transfer Rates

In one embodiment of the invention, the microlenses are laid out as a spiral chain on a rotating disc, in analogy with the guide track on CD discs. A tracking system ensures that the focused, converging beams from a laser cluster follow the spiral chain, and a signal is derived during the time window when the laser cluster is correctly positioned for writing through each microlens (writing "on the fly"). This type of arrangement probably provides the most direct and simple comparison with existing optical disc systems that can be laser written.

Several factors are responsible for limiting the attainable data transfer rate in traditional optical disc systems, the most important being media sensitivity, laser power level, and response time for tracking and autofocus systems. In order to provide some estimates which are of relevance in the current context, a crude but simple and representative model will be adopted here. The aggregate effects of the above-mentioned factors are expressed by defining the maximum speed v at which the writing laser beam can sweep the surface of the data carrier. While compact disc players (CD players) operate at a constant, standardized speed of 1.25 m/s, high quality optical disc systems operate at speeds of 10 m/s or more. For writing applications, it is difficult to increase this speed without incurring steeply rising costs.

A simple estimate of the data transfer rates which can be achieved with microlens-based media can be made as follows. The basic assumptions are that a chain of microlenses are used, where the center-to-center distance between adjacent microlenses is d and the microlenses are addressed by a laser cluster which sweeps along the chain at a speed which is v m/s. Furthermore, it is assumed that each microlens has n data spot positions which are written simultaneously by activation of a selected set of lasers in the cluster of n lasers. If each spot stores 1 bit, the data transfer rate is $R=nv/8d$ byte/s. If the data spot positions are laid out on the memory surface under each microlens in the same area-filling pattern as the microlenses, (e.g. hexagonally close-packed in both cases), with spot centre-to-centre distance equal to $\delta$, we have $n=d/\delta^2$ and $R=vd/8\delta^2$. By inserting some relevant numbers, e.g. $v=10$ m/s, $d=50$ $\mu$m, $\delta=0.35$ $\mu$m, we have $R=510$ Mbit/s.

In the example referred to at the beginning for storing of 2 Gbyte, it is now found that this amount of data can be transferred in approximately 4 s instead of approximately 33 min. as stated in the introduction as being typical for the prior art.

Microlens-based media will generally permit speeds v higher than those that can be sustained with traditional media. This is due, amongst other things, to the fact that they provide greater depth of focus and lateral tracking tolerances, thus imposing less stringent requirements on servosystem response speed. Moreover, the burn points will remain stationary when imaging through microlenses, despite a certain amount of parallel translation of the incident laser beams relative to the microlens. This increases the dwell time and thereby the writing beam energy emitted at each data spot.

Instead of encoding each datum spot with a binary 0 or 1, the memory medium and writing protocol can be chosen so as to cause a local change in the medium to follow steps in a scale of greylevels. Correspondingly, the response during reading of each spot will define a level on a scale extending from a minimum to a maximum value, implying that the spot can now store more than one bit of information. If each spot stores m bits, the storage speeds estimated above will increase proportionally, provided all other parameters remain unchanged.

EXAMPLE 3

Writing and Reading with Multiple Matrix Addressing

As described above, simultaneous access to a large number of datum spots can be achieved with microlens-based media by employing an addressing scheme where the position coordinates x,y and angular coordinates $\theta,\phi$ are defined by mutually independent, matrix-based subsystems. FIGS. 2 and 3 illustrate several different physical schemes for x,y and for $\theta,\phi$ addressing. In principle, as already mentioned, each of the former may be combined with each of the latter to form a great variety of complete x,y, $\theta,\phi$ addressing systems. The following examples are particularly relevant with regard to high speed optical memory systems without mechanical motion, but are in no way intended to represent the full range of designs which could come within the scope of the present application.

Thus, FIG. 5 shows a write/read device which combines the collimator solution of FIG. 2b on the illuminating side (cf. information on the collimator solution above), with a spatial light modulator for x,y selection as illustrated in FIG. 3 (cf. the description of the spatial light modulator above). For reading, the spatial light modulator SLM may be left in the open state at all pixels, the x,y address being determined by the detector matrix logic. The detector matrix is shown in proximity to or adjacent to the memory medium in FIG. 5. Alternatively, the memory medium may be imaged on to the detector matrix by an intervening lens. The burn film employed in the medium may be of the WORM (Write Once Read Many Times) type, or it may be erasable and rewritable. Examples of the former memory medium are hole-opening films of tellurium alloys or bleachable dye-in-polymer films. Examples of the latter memory medium are phase change films or magneto-optic (MO) films. In the latter case, coils for biasing the magnetic field must be added to the design of the write/read device. Alternatively, for transmissively read media, the data in the MO film may preferably be read via Faraday rotation of the polarization plane, rather than by Kerr rotation. It should be emphasized that the basic principles of matrix writing and reading by no means preclude reflectively read memory media, although transmissively read media are assumed here for the sake of simplicity.

FIG. 6 illustrates a write/read device where the collimator solution of FIG. 2b is combined with x,y addressing by light sensitization (cf. the above description of light-induced sensitization and FIG. 3a).

As illustrated in FIG. 6, the writing light is collimated by lens 1 and illuminates all microlenses equally from the left hand side of the figure. During writing, lens 2 images the x,y emitter matrix on to the burn film side of the medium, in the region under those microlenses where it is desired that writing is to take place. During reading, the x,y emitter matrix is not activated, and the pattern of information-bearing light spots in the memory medium is imaged by lens 2 on to the CCD detector matrix as shown.

The embodiments and examples described above are intended to demonstrate the possibilities which could be attainable within the scope of the present invention. For a person skilled in the art it will be obvious from the above that a great many other embodiments of both the method and the write/read device will also be achievable within the spirit and scope of the invention with no restrictions apart from those which are indicated in the hereto attached claims.

We claim:

1. A method for parallel writing and reading of data in an optical memory, comprising:

accessing an optical memory medium by the use of at least one of a plurality microlens, wherein the microlens has a uniquely defined (x, y) position in a coordinate reference assigned to the memory medium;

assigning, to the microlens, a plurality of data carrying spot positions in a data layer within the optical memory medium, wherein each spot position is assigned a data address corresponding to a set of incidence angles ($\theta$, $\phi$) of light that is directed through the microlens, the set of incidence angles ($\theta$, $\phi$) defining angular coordinates;

activating a matrix which is positioned freely in relation to the optical memory medium to access the angular coordinates of a data-carrying spot position under a microlens;

selecting an (x, y) position of the microlens relative to the coordinate reference on the optical memory medium, wherein the steps of activating and selecting provide a complete four-coordinate address ($\theta$, $\phi$, x, y) for a data-carrying spot position, so that data is simultaneously written to or read from each of the available spot positions under each of the respective microlens.

2. A method according to claim 1, further comprising employing addressable electrodes in the matrix in order to induce a thermal effect in at least one of the data carrying spot positions in the data carrying layer.

3. A method according to claim 1, further comprising employing addressable electrodes which are in direct contact with the data carrying layer in the memory as addressable elements in the matrix.

4. A method according to claim 1, further comprising employing addressable optical detectors in the matrix.

5. A method according to claim 1, wherein said matrix is a two-dimensional array.

6. The method according to claim 1, wherein the step of activating a matrix further includes inducing at least one of an optical, thermal, electrical, magnetic and chemical effect in the data layer.

7. The method according to claim 1, wherein the step of assigning includes defining each angle of incidence as spherical coordinates in the coordinate system assigned to the memory medium.

8. The method according to claim 1, further comprising employing a plurality of light emitters in the matrix.

9. A method according to claim 8, further comprising employing an optically active element, common to all the light emitters of the matrix for directing light from each light emitter towards one of a microlens and a data carrying layer assigned to the microlens.

10. A method according to claim 8, further comprising employing optical elements assigned to each light emitter, for directing light from each light emitter towards one of a microlens and a data carrying layer assigned to the microlens.

11. A method according to claim 8, further comprising activating the light emitters simultaneously.

12. A method according to claim 8, further comprising activating the light emitters sequentially.

13. A method according to claim 8, further comprising activating the light emitters independently.

14. A method according to claim 8, further comprising arranging the light emitters in a surface which is located at a distance from a lens equal to the focal length of the lens, and positioning the light emitters in the surface in such a manner that light from each light emitter is collimated in a direction which is uniquely defined by the light emitter's position in the surface.

15. A method according to claim 8, further comprising employing a spatial light modulator for selecting the individual microlens for accessing of the optical memory medium.

16. A method according to claim 8, further comprising covering the microlens with photo-sensitive film and using the photo-sensitive film for selecting the individual microlens for accessing of the optical memory medium.

17. A method according to claim 8, further comprising employing semiconductor lasers as light emitters.

18. A method according to claim 17, further comprising employing vertical cavity surface emitting lasers (VCSEL) as semiconductor lasers.

19. A method according to claim 8, further comprising directing at least one beam of light towards the microlenses and selecting the individual microlens for accessing of the optical memory medium in accordance with a level of absorption of the at least one light beam in a data carrying layer which is assigned to that microlens.

20. A method according to claim 19, said at least one light beam inducing a local thermal effect in the data carrying layer.

21. A method according to claim 19, said at least one light beam inducing at least one of a photo-electric and a photo-chemical sensitization of the data carrying layer with regard to light which is incident on and is focused by the microlens.

22. A write/read device for parallel writing and reading of data in an optical memory, comprising:

an optical memory medium;

at least one microlens for accessing the optical memory medium, wherein the microlens has a uniquely defined (x, y) position in a coordinate reference assigned to the memory medium;

a plurality of data carrying spot positions in a data layer within the optical memory medium, wherein the plurality of spot positions are assigned to the microlens, and wherein each spot position is assigned a data address corresponding to a set of incidence angles ($\theta$, $\phi$) of light that is directed through the microlens, the set of incidence angles ($\theta$, $\phi$) defining angular coordinates;

a matrix to access the angular coordinates of a data-carrying spot position under a microlens; and a selector to select an (x, y) position of the microlens relative to a coordinate reference on the optical memory medium, wherein the matrix and selector provide a complete four-coordinate address ($\theta$, $\phi$, x, y) for a data-carrying spot position, so that data is simultaneously written to or read from each of the available spot positions under each of the respective microlens.

23. The use of the method according to claim 1 or the write/read device according to claim 22 for parallel writing and reading in an optical memory which comprises from 1 to 100 microlenses with an associated data carrying layer.

24. The use of the method according to one of the claim 1 or the write/read device according to claim 22 for parallel writing and reading in an optical memory consisting of a transparent spherical particle, on one side of which is provided a transparent layer which is applied to a data carrying film.

25. A write/read device according to claim 22, further comprising: an electrical or optical spatial light modulator.

26. A write/read device according to claim 22, wherein said matrix is a two-dimensional array.

27. The write/read device according to claim 22, wherein each angle of incidence is defined as spherical coordinates in the coordinate system assigned to the memory medium.

28. The write/read device according to claim 22, wherein the matrix is part of a free-propagation addressing scheme which does not require a collimator.

29. The write/read device according to claim 22, wherein the matrix further includes a plurality of light emitters.

30. A write/read device according to claim 29, further comprising an optically active element which is common to all light emitters.

31. A write/read device according to claim 29, further comprising an optically active element for each of the light emitters.

32. A write/read device according to claim 29 further comprising a lens wherein the light emitting elements are arranged in a surface which is located at a distance from the lens equal to the focal length of the lens, and that the light emitting elements are so positioned in the surface that the light from a light emitter is collimated by the lens in a direction which is uniquely defined by the light emitter's position in the surface.

33. A write/read device according to claim 29, wherein at least two of the addressable elements are optical detectors.

34. A write/read device according to claim 29, wherein the light emitters are semiconductor lasers.

35. A write/read device according to claim 34, wherein the semiconductor lasers are vertical cavity surface emitting lasers (VCSEL).

36. A write/read device according to claim 29, wherein matrix is arranged in or on the optical memory and integrated therewith.

37. A write/read device according to claim 36, wherein the matrix includes at least two addressable electrodes, the addressable electrodes inducing a thermal effect in at least one of the data carrying spot positions in the data carrying layer.

38. A write/read device according to claim 36, wherein the matrix includes at least two addressable electrodes which are in direct contact with the data carrying layer in the memory.

39. A method for parallel writing and reading of data in an optical memory, comprising:
   accessing an optical memory medium by the use of at least one of a plurality microlens, wherein the microlens has a uniquely defined (x, y) position in a coordinate reference assigned to the memory medium;
   assigning, to the microlens, a plurality of data carrying spot positions in a data layer within the optical memory medium, wherein each spot position is assigned a data address corresponding to a set of incidence angles ($\theta$, $\phi$) of light that is directed through the microlens, the set of incidence angles ($\theta$, $\phi$) defining angular coordinates;
   activating a selected one of plural emitter elements of an emitter matrix to access, via an emitted accessing beam, the angular coordinates of a data-carrying spot position under each microlens, wherein said emitter matrix selects angular coordinates ($\theta$, $\phi$) for all uniquely defined (x, y) positions; and
   selecting uniquely defined (x, y) positions of selected microlens relative to a coordinate reference on the optical memory medium, wherein the accessed angular coordinates ($\theta$, $\phi$) and the (x, y) provide a complete four-coordinate address ($\theta$, $\phi$, x, y) to enable parallel reading from and parallel writing to each of the available spot positions under each respective microlens.

40. The method according to claim 39, wherein the step of selecting uniquely defined (x, y) positions of selected microlens relative to a coordinate reference on the optical memory medium further comprises supplying supplemental light to supplement said accessing beam so as to enable parallel writing to each of the available spot positions under each respective microlens.

41. The method according to claim 39, wherein the step of assigning includes defining each angle of incidence as spherical coordinates in the coordinate system assigned to the memory medium.

42. The method according to claim 39, wherein the step of selecting uniquely defined (x, y) positions of selected microlens relative to a coordinate reference on the optical memory medium further comprises attenuating the accessing beam to prevent selection of unselected ones of said uniquely defined (x, y) positions.

43. The method according to claim 42, wherein the step of attenuating the accessing beam further comprises employing a spatial light modulator.

44. The method according to claim 39, wherein the step of activating a selected one of plural emitter elements of an emitter matrix to access the angular coordinates of a data-carrying spot position under a microlens is performed by activating a first emitter matrix, and wherein the step of selecting uniquely defined (x, y) positions of selected microlens relative to a coordinate reference on the optical memory medium is performed by activating a second emitter matrix.

45. The method according to claim 44, wherein the first emitter matrix accesses the angular coordinates independently from the second emitter matrix accessing the position of the microlens, and wherein the second emitter matrix is only activated for the writing of data simultaneously from each of the available spot positions under each respective microlens.

46. The method according to claim 44, wherein the steps of activating a first and second emitter matrix further includes inducing at least one of an optical, thermal, electrical, magnetic and chemical effect in the data layer.

47. The method according to claim 44, further comprising employing light emitters in at least one of the emitter matrices.

48. A write/read device for parallel writing and reading of data in an optical memory, comprising:
   an optical memory medium;
   at least one microlens for accessing the optical memory medium, wherein the microlens has a uniquely defined (x, y) position in a coordinate reference assigned to the memory medium;
   a plurality of data carrying spot positions in a data layer within the optical memory medium, wherein the plurality of spot positions are assigned to the microlens, and wherein each spot position is assigned a data address corresponding to a set of incidence angles ($\theta$, $\phi$) of light that is directed through the microlens, the set of incidence angles ($\theta$, $\phi$) defining angular coordinates;
   an emitter matrix accessing the angular coordinates ($\theta$, $\phi$) of a data-carrying spot position under each microlens by emitting an accessing beam, wherein said emitter matrix selects angular coordinates ($\theta$, $\phi$) for all uniquely defined (x, y) positions by supplying said accessing beam thereto; and
   a selector selecting uniquely defined (x, y) positions of selected microlens, wherein the accessed angular coordinates ($\theta$, $\phi$) and (x, y) provide a complete four-coordinate address ($\theta$, $\phi$, x, y) to enable parallel reading from and parallel writing to each of the available spot positions under each respective microlens.

49. The write/read device according to claim 48, wherein the selector supplies supplemental light to supplement said accessing beam so as to enable parallel writing to desired spot positions under each respective microlens.

50. The write/read device according to claim 48, wherein each angle of incidence is defined as spherical coordinates in the coordinate system assigned to the memory medium.

51. The write/read device according to claim 48, wherein the emitter matrix is part of a free-propagation addressing scheme which does not require a collimator.

52. The write/read device according to claim 48, wherein the selector attenuates the accessing beam to prevent selection of unselected ones of said uniquely defined (x, y) positions.

53. The write/read device according to claim 52, wherein the selector is a spatial light modulator.

54. The write/read device according to claim 48, wherein the emitter matrix is a first emitter matrix, and wherein the selector is a second emitter matrix.

55. The write/read device according to claim 54, wherein the first emitter matrix accesses the angular coordinates independently from the second emitter matrix accessing the position of the microlens, and wherein the second emitter matrix is only activated for the writing of data simultaneously from each of the available spot positions under each respective microlens.

56. The write/read device according to claim 54, wherein at least one of the emitter matrices further includes light emitters.

57. A method for parallel writing of data in an optical memory, comprising:

(a) supplying a first light at less then a write threshold to a plurality of uniquely defined positions in a coordinate reference assigned to a microlens-based memory medium, wherein each position is assigned a first address corresponding to a first subset of said plurality of uniquely defined positions;

(b) supplying a second light at less than a write threshold to the microlens-based memory medium to provide a second address for each of the uniquely defined positions in the memory medium, wherein the second address corresponds to a second subset of said plurality of uniquely defined positions, each uniquely defined position being uniquely specified by the first and second address;

the first and second address being supplied by steps (a) and (b) being additive to exceed the write threshold and to uniquely address each of the uniquely defined positions; and simultaneously writing logic data to those uniquely defined positions specified by a single first address in parallel by selectively supplying the second light to all uniquely defined positions specified by said first address to write a desired logic thereto.

58. The method according to claim 51, wherein the step of supplying a first light further comprises defining angular coordinates ($\theta$, $\phi$) for each of the uniquely defined positions underneath a microlens in the microlens-based memory medium.

59. The method according to claim 57, wherein the step of supplying a second light further comprises determining positional coordinates (x, y) to define the location of a microlens in the microlens-based memory medium, and wherein each microlens in the memory medium has a plurality of uniquely defined positions located underneath it.

60. A device for parallel writing of data in an optical memory, comprising:

a first light supplied at less then a write threshold to a plurality of uniquely defined positions in a coordinate reference assigned to a microlens-based memory medium, wherein each position is assigned a first address corresponding to a first subset of said plurality of uniquely defined positions;

a second light supplied at less than a write threshold to the microlens-based memory medium to provide a second address for each of the uniquely defined positions in the memory medium, wherein the second address corresponds to a second subset of said plurality of uniquely defined positions, each uniquely defined position being uniquely specified by the first and second address, and wherein the first light and second light are additive to exceed the write threshold to uniquely address each of the uniquely defined positions, and to simultaneously write logic data to those uniquely defined positions specified by a single first address in parallel by selectively supplying the second light to all uniquely defined positions specified by said first address, thereby writing a desired logic thereto.

61. The device according to claim 60, wherein the first subset comprises angular coordinates ($\theta$, $\phi$) associated with each of the uniquely defined positions underneath a microlens in the microlens-based memory medium.

62. The device according to claim 60, wherein the second subset comprises positional coordinates (x, y) associated with a location of a microlens in the microlens-based memory medium, wherein each microlens in the memory medium has a plurality of uniquely defined positions located underneath it.

* * * * *